(12) United States Patent
Ato et al.

(10) Patent No.: US 11,031,335 B2
(45) Date of Patent: Jun. 8, 2021

(54) SEMICONDUCTOR DEVICES INCLUDING REDISTRIBUTION LAYERS

(71) Applicant: Micron Technology, Inc., Boise, ID (US)

(72) Inventors: Hirokazu Ato, Kanagawa (JP); Koji Yasumori, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/374,418

(22) Filed: Apr. 3, 2019

(65) Prior Publication Data

US 2020/0321278 A1    Oct. 8, 2020

(51) Int. Cl.
*H01L 23/52* (2006.01)
*H01L 23/528* (2006.01)
*H01L 23/522* (2006.01)

(52) U.S. Cl.
CPC ...... *H01L 23/5283* (2013.01); *H01L 23/5226* (2013.01)

(58) Field of Classification Search
CPC ............... H01L 23/5283; H01L 23/5226
See application file for complete search history.

(56) References Cited

U.S. PATENT DOCUMENTS

| | | |
|---|---|---|
| 5,790,839 A | 8/1998 | Luk et al. |
| 5,812,490 A | 9/1998 | Tsukude |
| 6,172,935 B1 | 1/2001 | Wright et al. |
| 6,937,494 B2 | 8/2005 | Funaba et al. |
| 7,646,654 B2 | 1/2010 | Merritt et al. |
| 8,116,114 B2 | 2/2012 | Kobayashi et al. |
| 9,117,496 B2 | 8/2015 | Shaeffer et al. |
| 10,115,709 B1 | 10/2018 | Sasaki et al. |
| 2006/0245267 A1 | 11/2006 | Choi |
| 2007/0291557 A1 | 12/2007 | Nishio et al. |
| 2008/0304340 A1 | 12/2008 | Kyung et al. |
| 2009/0161475 A1 | 6/2009 | Kim et al. |
| 2010/0115172 A1 | 5/2010 | Gillingham et al. |

(Continued)

FOREIGN PATENT DOCUMENTS

| | | |
|---|---|---|
| JP | 2017-174994 A | 9/2017 |
| KR | 10-2019-0017266 A | 2/2019 |

OTHER PUBLICATIONS

International Search Report for Application No. PCT/US2020/018742, dated Jun. 16, 2020, 3 pages.

(Continued)

*Primary Examiner* — Fernando L Toledo
*Assistant Examiner* — Valerie N Newton
(74) *Attorney, Agent, or Firm* — TraskBritt (57) ABSTRACT

Semiconductor devices may include a substrate and a redistribution layer. The redistribution layer may include a dielectric material and electrically conductive material. Vias may extend through the dielectric material. A first region of the electrically conductive material may be connected to a first subset of vias in a row from a first lateral side of the row, the first region occupying more than half of a width of the row on the first lateral side. A second region of the electrically conductive material may be connected to a second subset of vias in the row from a second, opposite lateral side of the row, the second region occupying more than half of the width of the row on the second lateral side.

20 Claims, 5 Drawing Sheets

(56) References Cited

U.S. PATENT DOCUMENTS

| | | |
|---|---|---|
| 2013/0162308 A1 | 6/2013 | Sakashita et al. |
| 2014/0082260 A1 | 3/2014 | Oh et al. |
| 2014/0117424 A1* | 5/2014 | Kim .................. H01L 23/4824 257/288 |
| 2015/0348905 A1 | 12/2015 | Tsai et al. |
| 2016/0181214 A1 | 6/2016 | Oh et al. |
| 2016/0196878 A1 | 7/2016 | Kim et al. |
| 2016/0240471 A1 | 8/2016 | Klowak et al. |
| 2016/0293227 A1 | 10/2016 | Chi |
| 2017/0077276 A1 | 3/2017 | Suzuki et al. |
| 2017/0323875 A1 | 11/2017 | Tam |
| 2017/0338175 A1 | 11/2017 | Liu et al. |
| 2018/0090185 A1 | 3/2018 | Hossain et al. |
| 2018/0130739 A1 | 5/2018 | Miura et al. |
| 2018/0218762 A1 | 8/2018 | Matsui |
| 2019/0081623 A1 | 3/2019 | Mizan et al. |

OTHER PUBLICATIONS

Written Opinion of the International Searching Authority for Application No. PCT/US2020/018742, dated Jun. 16, 2020, 4 pages.

* cited by examiner

SEMICONDUCTOR DEVICES INCLUDING REDISTRIBUTION LAYERS

FIELD

This disclosure relates generally to routing techniques for redistribution layers of semiconductor devices. More specifically, disclosed embodiments relate to configurations for electrically conductive regions of redistribution layers that may reduce resistance of the redistribution layers and improve signal and voltage consistency across an area of a semiconductor device and enhance performance of the semiconductor device.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device or component thereof, but are merely idealized representations employed to describe illustrative embodiments. Thus, the drawings are not necessarily to scale.

Disclosed embodiments relate generally to configurations for electrically conductive regions of redistribution layers that may reduce resistance of the redistribution layers and improve signal and voltage consistency across an area of a semiconductor device. More specifically, disclosed are embodiments of shapes, sizes, and positions for electrically conductive regions of redistribution layer that may manipulate width and changes in width and may be connected to vias of portions of the redistribution layers from different lateral directions.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

Figure 1:
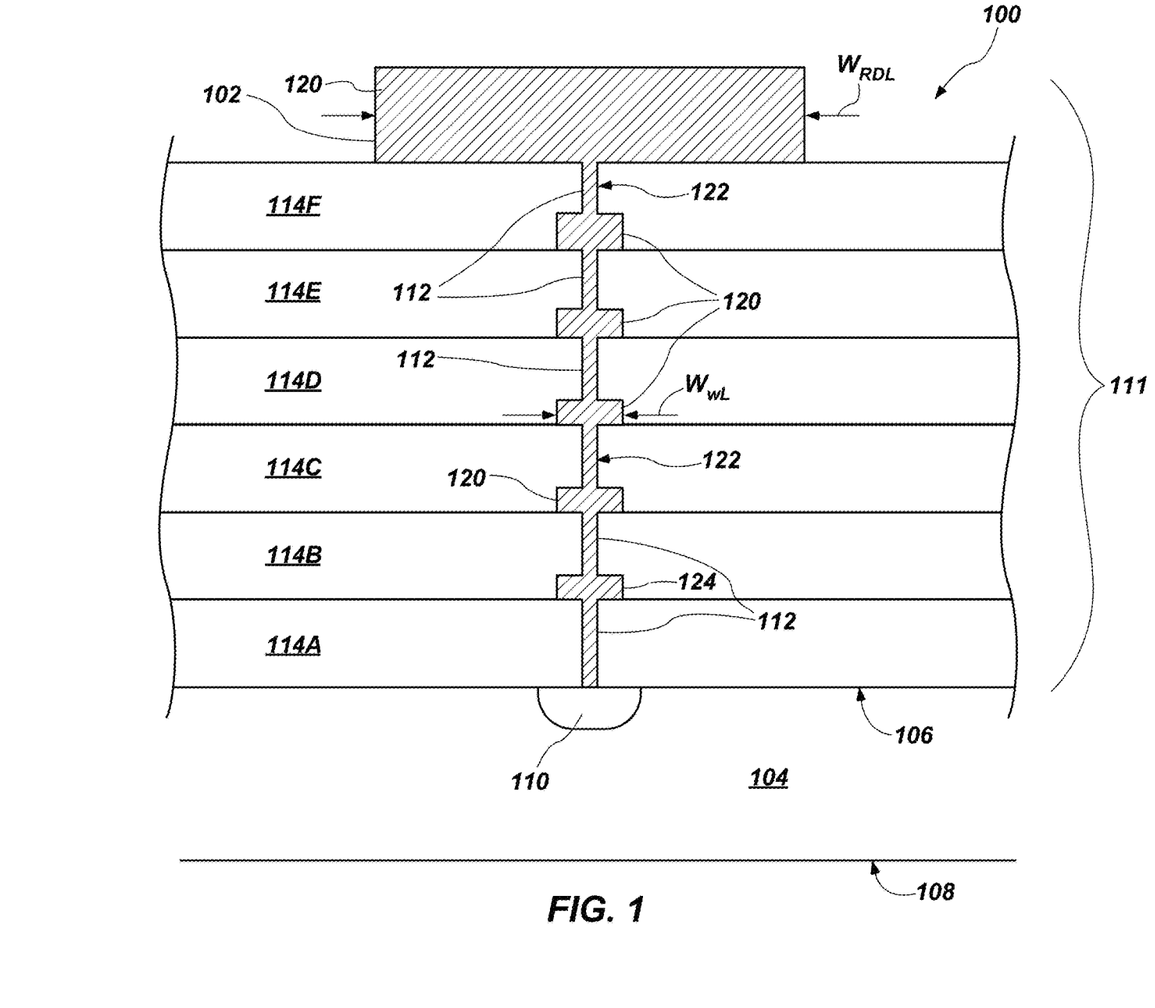
FIG. 1 is a cross-sectional view of a semiconductor device including a redistribution layer.

FIG. 1 is a cross-sectional view of a semiconductor device 100 including a redistribution layer 102 in accordance with this disclosure. The semiconductor device 100 may include a substrate 104 on or above which the redistribution layer 102 may be supported. The substrate 104 may be at least partially formed from semiconductor material, such as, for example silicon. The substrate 104 may include an active surface 106 and an inactive surface 108 located on a side of the substrate 104 opposite the active surface 106. The active surface 106 may include diffusion regions 110 of integrated circuitry embedded within or supported on the active surface 106. For example, the active surface 106 may include integrated circuitry including diffusion regions 110 configured to operate as a hardware memory component of a computing system, such as, for example, random-access memory (RAM). More specifically, the diffusion regions 110 of the integrated circuitry at the active surface 106 of the substrate 104 may be configured to operate as synchronous dynamic random-access memory (SDRAM) under a low-power double data rate (LP-DDR) specification, such as, for example, LP-DDR4, -DDR4X, or -DDR5. Integrated circuitry including diffusion regions 110 of the substrate 104 at locations laterally proximate to the vias 112 may include, for example, circuits critical to product specifications and quality, such as, for example, power supply circuits, access pass circuits, and buffer circuits. Integrated circuitry including diffusion regions 110 of the substrate 104 at locations laterally distal from the vias 112 may include, for example, circuits for which low resistance may be less critical, such as, for example, logic circuits and compensation capacitance circuits. The inactive surface 108 may be at least substantially free of integrated circuitry.

The redistribution layer 102 may be configured to route voltages and electrical signals, which may also be routed to and/or from the substrate 104. For example, the redistribution layer 102 may be electrically connected to the diffusion regions 110 of the integrated circuitry at the active surface 106 utilizing vias 112 and wiring layers 111 interposed between the redistribution layer 102 and the substrate 104. The vias 112 may extend from proximate to the active surface 106, through one or more quantities of dielectric material 114, to form an electrical connection with electrically conductive material 120 located on a side of the vias 112 opposite the substrate 104. When a respective quantity of dielectric material 114 has been put in place, such as, for example, directly adjacent to the active surface 106 or adjacent to another quantity of dielectric material 114, each via 112 may be connected to a respective wiring layer 111 located on a side of that quantity of dielectric material 114 opposite the substrate 104 until the vias 112 reach the redistribution layer 102. Regions of electrically conductive material 120 may extend laterally from vias 112, along the respective quantity of dielectric material 114, to other, laterally located vias 112 to redistribute signals and voltages laterally across the active surface 106 of the substrate, enabling connection to a respective diffusion region 110 of the integrated circuitry from locations distal from the diffusion regions 110 of the integrated circuitry. The regions of electrically conductive material 120 are depicted in FIG. 1 in cross-section, such that the regions of electrically conductive material 120 may extend laterally in a direction perpendicular to the plane of the cross-sectional view of FIG. 1. The regions of electrically conductive material 120 may be located on a side of the respective quantity of dielectric material 114 opposite the substrate 104, such that at least one quantity of dielectric material may be interposed between the substrate 104 and the laterally extending regions of electrically conductive material 120.

A first of the wiring layers 111 may be formed, for example, by forming or depositing a first quantity of dielectric material 114A on the active surface 106. In some embodiments, the first quantity of dielectric material 114A may be formed over the active surface 106 of the substrate 104, and the vias 112 may extend to and be electrically connected to electrically conductive traces 124. Recesses 122 may be formed in the first quantity of dielectric material 114A (e.g., using a mask and etching process), and masses of electrically conductive material may be placed in the recesses 122 to form the vias 112 (e.g., by a plating or sputtering process). Regions of electrically conductive material 120 may be placed on a side of the quantity of dielectric material 114A opposite the substrate 104 and may be electrically connected to one or more of the vias 112 (e.g., using a mask and plating or sputtering process, or by blanket deposition followed by patterning). Regions of electrically conductive material 120 may be formed sequentially or simultaneously. The process may then be repeated for as many times as there are individual routing sections required or desired for the wiring layers 111, such as, for example, with second through fifth quantities of dielectric material 114B through 114E. After placing a final quantity of dielectric material 114F farthest from the substrate 104 and forming vias 112 therethrough, a conductive material of the redistribution layer having a larger lateral footprint than the regions of electrically conductive material 120 may be electrically connected to at least some of the vias 112 on a side of the final quantity of dielectric material 114F opposite the substrate 104. The regions of electrically conductive material 120 may be placed on a side of the quantity of dielectric material 114F opposite the substrate 104 and may be electrically connected to one or more of the vias 112 (e.g., using a mask and plating or sputtering process, or by blanket deposition followed by patterning). A width $W_{RDL}$ of the electrically conductive material 120 of the redistribution layer 102 may be greater than the widths $W_{WL}$ of the respective quantities of the electrically conductive material 120 of the wiring layers 111 interposed between the redistribution layer 102 and the substrate 104.

Dielectric materials suitable for use as one or more of the quantities of dielectric material 114 may include, but are not limited to, oxides (e.g., silicon oxide) and polymers (e.g., resins, films, etc.). Electrically conductive materials suitable for use as one or more of the electrically conductive material 120 and/or electrically conductive traces 124 may include, but are not limited to, gold, copper, aluminum, and alloys thereof.

Figure 2:
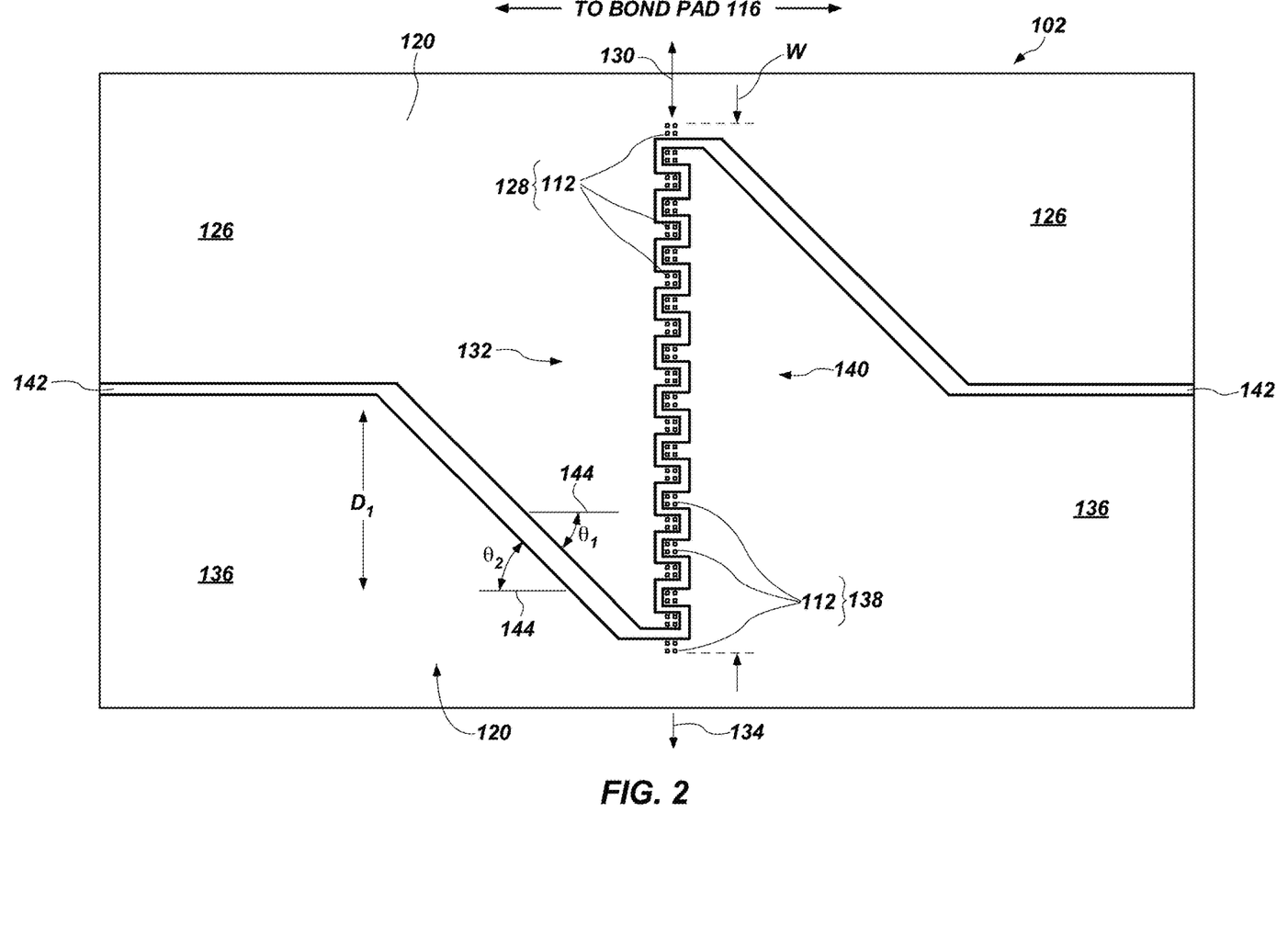
FIG. 2 is a top view of a portion of the redistribution layer of FIG. 1.

FIG. 2 is a top view of a portion of the redistribution layer 102 of FIG. 1. A first region 126 of the electrically conductive material 120 may be connected to a first subset 128 of the vias 112 in a row 130 of the vias 112 from a first lateral side 132 of the row 130. For example, the first region 126 may approach the individual vias 112 in the first subset 128 of the row 130 from proximate to a bond pad 116, which may be arranged near a lateral edge of a semiconductor device, configured to supply a specific voltage or signal (e.g., directly from a power source or indirectly via another device electrically connected to the bond pad 116) and connect to the first subset 128 of the vias 112 in the row 130, such that the first region 126 may be located laterally between the bond pad 116 and the row 130. As a specific, nonlimiting example, the bond pad 116 may be configured to provide a positive supply voltage (e.g., VDD, VDD2) to the diffusion regions 110 of the integrated circuitry of the substrate 104 (see FIG. 1) by way of the vias 112 and the first region 126 of electrically conductive material 120.

The first region 126 may occupy more than half of a width W of the row 130 on the first lateral side 132, as measured in a direction $D_1$ parallel to a geometric center 134 of the row 130 extending through or adjacent to all the vias 112 in the row 130. For example, the first region 126 may increase in width as distance to the row 130 decreases when approaching from the first lateral side 132, such that the width of the first region 126 may be at or near its maximum when making electrical connections to the first subset 128 of vias 112 in the row 130. More specifically, the first region 126 may increase in width from occupying about half the width W of the row 130 to occupying greater than three-fourths of the width W of the row 130 as the first region 126 approaches the row 130 from the first lateral side 132. As a specific, nonlimiting example, the first region 126 may increase in width from occupying between about 40% and about 49% (e.g., about 45%) of a laterally projected width W of the row 130 to occupying between about 90% and about 98% (e.g., about 95%) of the laterally projected width W of the row 130. The first region 126 may then decrease in width along the row 130 on the first lateral side 132, such that the width of the first region 126 may be at or near its minimum when routing around the row 130 approaching toward a second, opposite lateral side 140 of the row 130.

A second region 136 of the electrically conductive material 120 may be connected to a second subset 138 of the vias 112 in the same row 130 of the vias 112 from a second, opposite lateral side 140 of the row 130. For example, the second region 136 may approach a majority of the individual vias 112 in the second subset 138 of the row 130 from a side of the row 130 opposite a side from which the first region 126 approaches the same row 130 is located, such that the row 130 may be located laterally between the second region 136 and the first region 126. As a specific, nonlimiting example, another bond pad 116 may be configured to provide a second supply voltage (e.g., VSS) to the diffusion regions 110 of the integrated circuitry of the substrate 104 (see FIG. 1) by way of the vias 112 and the second region 136 of electrically conductive material 120. The first region 126 and the second region 136 may also be characterized as respective wires, wiring, conductive lines, or traces of the redistribution layer 102.

Figure 8:
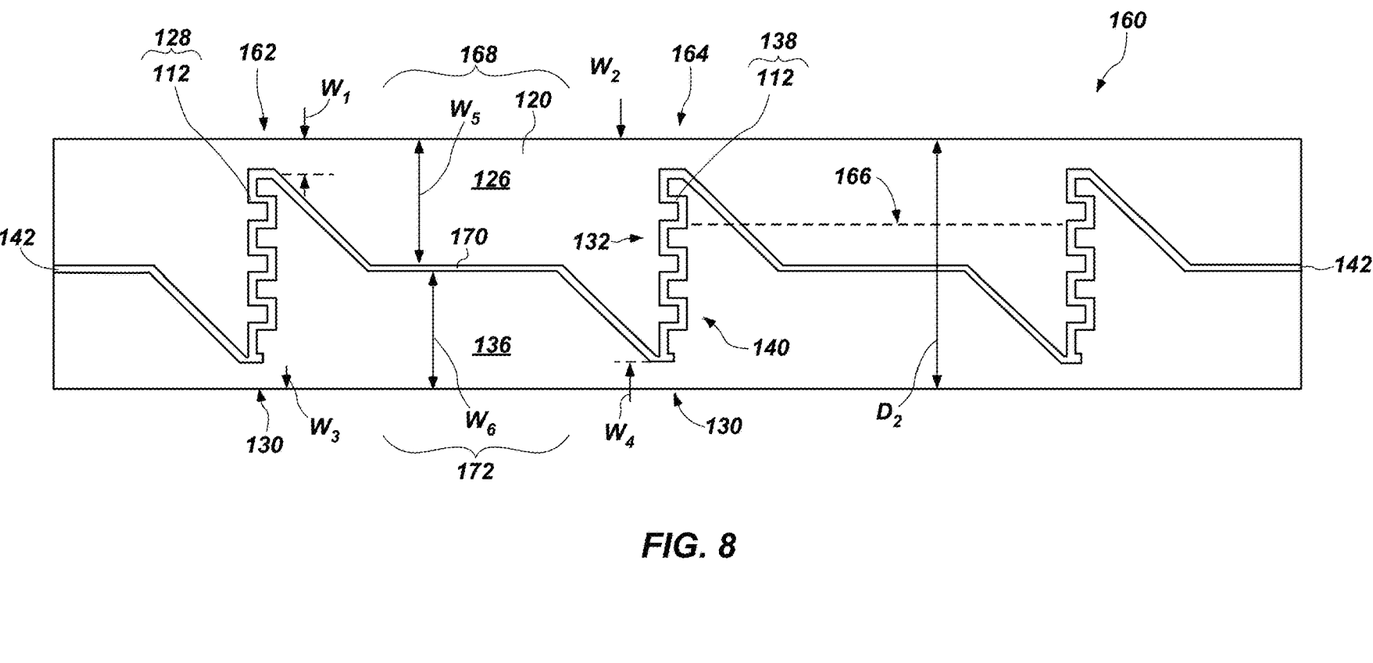
FIG. 8 is a zoomed-out top view of another embodiment of the portion of the redistribution layer.

Because the respective bond pads 116 may generally be located proximate to one another, the first region 126 and the second region 136 of electrically conductive material 120 may extend adjacent to one another between different rows 130 of vias 112 of the redistribution layer 102, additional detail for which is depicted in FIG. 8. The first region 126 may approach each row 130 from the first lateral side 132, connect to the respective row 130 on the first lateral side 132, be routed around the row 130 to the second lateral side 140, and continue to the next row 130. The second region 136 may approach each row 130 from the first lateral side 132, be routed around the respective row 130 to the second lateral side 140, connect to the respective row 130 primarily on the second lateral side 140, and continue to the next row 130. In some embodiments, the second region 136 may connect to an outermost via 112 in the row from the first lateral side 132 as the second region is routed around the row 130 to the second lateral side 140.

The second region 136 may occupy more than half of the width W of the row 130 on the second lateral side 140, as measured in the direction $D_1$ parallel to the geometric center 134 of the row 130 extending through or adjacent to all the vias 112 in the row 130. For example, the second region 136 may decrease in width at least substantially commensurate with the increase in width of the first region 126 as distance to the row 130 decreases when approaching from the first lateral side 132, such that the width of the second region 136 may be at or near its minimum when being routed around the row 130 and connecting to an outermost one of the second subset 138 of the vias 112.

The second region 136 may then increase in width along the row 130 on the second lateral side 140, such that the width of the second region 136 may be at or near its maximum when making connections to the other vias 112 in the second subset 138 approaching back toward the first lateral side 132 from the second lateral side 140. More specifically, the second region 136 may increase in width from its minimum width proximate to the outermost one of the second subset 138 of the vias 112 to occupying greater than three-fourths of the width W of the row 130 as the second region 136 approaches the row 130 from the second lateral side 140. As a specific, nonlimiting example, the second region 136 may occupy between about 90% and about 98% (e.g., about 95%) of the laterally projected width W of the row 130 adjacent to the row 130 on the second lateral side 140.

Finally, the second region 136 may decrease in width with increasing distance from the row 130, and the first region 126 may correspondingly increase in width with increasing distance from the row 130. The change in width may return the first region 126 to occupy about half the projected width of the row 130, and may bring the width of the second region 136 to occupy about half the projected width of the row 130, such that the widths of the first region 126 and the second region 136 may be at least substantially equal at a location distal from the row 130. An isolation gap 142 may remain between the first region 126 and the second region 136 along their lateral lengths and between the via grouping of row 130, keeping voltages and signals carried by the first region 126 and the second region 136 from interacting with one another. The isolation gap 142 may be formed by refraining from placing the electrically conductive material 120 in the area of the isolation gap 142, and the isolation gap 142 may subsequently be filled with the final quantity of dielectric material 114F (see FIG. 1).

The width of the first region 126 may increase gradually on the first lateral side 132 of the row 130 and decrease gradually on the second lateral side 140 of the row 130. For example, a first angle $\theta_1$ between an edge of the first region 126 where the width of the first region 126 is increasing and a line 144 perpendicular to the previously discussed direction $D_1$ on the first lateral side 132 and/or on the second lateral side 140 of the row 130 may be between about 30° and about 60° (e.g., about 45°). Similarly, a second angle $\theta_2$ between an edge of the second region 136 where the width of the second region 136 is decreasing and the line 144 on the first lateral side 132 and/or on the second lateral side 140 of the row 130 may be between about 30° and about 60° (e.g., about 45°).

By manipulating the width of the first region 126 and the second region 136, as well as the rate of change of the width of the first region 126 and the second region 136, proximate to the location where the first region 126 and the second region 136 connect to the respective vias 112 in a given row 130, the resistance of the routing paths of the redistribution layer 102 may be reduced. As a result, signals and voltages conducted by the bond pads 116, through the vias 112, and across the first region 126 and second region 136 of electrically conductive material may more closely match intended impedance parameters for input signals and voltages, particularly as distance from the bond pads 116 increases, enabling a more consistent response from diffusion regions 110 of integrated circuitry across the active surface 106 of the substrate 104 (see FIG. 1).

As one illustrative example, semiconductor devices in accordance with this disclosure may include a substrate comprising a semiconductor material and a redistribution layer supported on the substrate. The redistribution layer may include an electrically conductive material located on a side of a dielectric material opposite the substrate. Vias may extend through the dielectric material toward the substrate. A first region of the electrically conductive material may be connected to a first subset of vias in a row of the vias from a first lateral side of the row, the first region occupying more than half of a width of the row on the first lateral side, as measured in a direction parallel to a geometric center of the row extending through or adjacent to all the vias in the row. A second region of the electrically conductive material may be connected to a second subset of vias in the row from a second, opposite lateral side of the row, the second region occupying more than half of the width of the row on the second lateral side.

FIGS. 3 through 7 are top views of portions of a semiconductor device showing a route of voltage supply from the redistribution layer down through various wiring layers to circuitry at the substrate. For ease of description, and not limitation, these figures will be described as using the redistribution layer down to an M4 wiring layer, an M3 wiring layer, an M2 wiring layer, and an M1 wiring layer. Other embodiments may include different numbers of wiring layers. Also, for ease of description, and not limitation, these figures will describe the voltages being coupled down through the layers as VDD2 and VSS. Other embodiments may use other signals.

Figure 3:
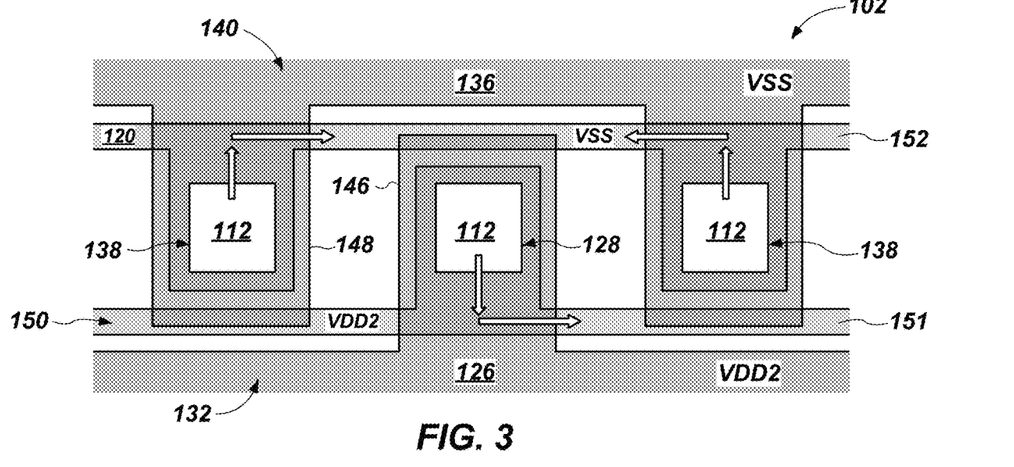
FIG. 3 is a zoomed-in top view of the portion of the redistribution layer of FIG. 2.

FIG. 3 is a zoomed-in top view of the portion of the redistribution layer 102 of FIG. 2, as well as wiring on the M4 layer and vias between the redistribution layer and the M4 layer. The first region 126 may include traces 146 extending from the first region 126 at its widest width on the first lateral side 132 of the row 130 to the vias 112 of the first subset 128. The second region 136 may also include traces 148 extending from the second region 136 at its widest width on the second lateral side 140 of the row 130 to the vias 112 of the second subset 138. The traces 146 of the first region 126 may alternate with the traces 148 of the second region 136, such that the traces 146 of the first region 126 may resemble a row of teeth or cogs interlocking with, and spaced from, the traces 148 of the second region 136. Likewise, the vias 112 of the first subset 128 may be flanked by the vias 112 of the second subset 138 and vice versa, such that the first subset 128 may be positioned in an alternating pattern with respect to the second subset 138. In other words, the first subset 128 of the row 130 of vias 112 may align with the vias 112 of the second subset in an alternating pattern along the row 130.

The first subset 128 of vias 112 may convey the VDD2 voltage down to a wire 151 on the M4 layer. The second subset 138 of vias 112 may convey the VSS voltage down to a wire 152 on the M4 layer.

Figure 4:
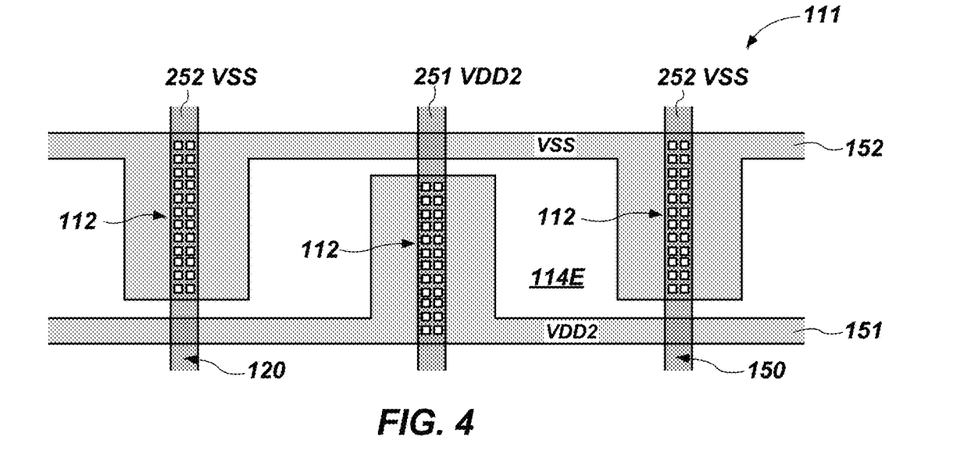
FIG. 4 is a zoomed-in top view of a portion of a wiring layer of FIG. 1.

FIG. 4 is a zoomed-in top view of the same portion of the semiconductor device of FIG. 3 and showing the M4 layer of FIG. 3, as well as wiring on the M3 layer and vias between the M4 layer and the M3 layer. Vias 112 in a grouping in the center of the figure may convey the VDD2 voltage from the wire 151 on the M4 layer down to a wire 251 on the M3 layer. Vias 112 in groupings on the left and right sides of the figure may convey the VSS voltage from the wire 152 down to wires 252 on the M3 layer.

The wiring layer 111 depicted in FIG. 4 may correspond, for example, to the quantities of electrically conductive material 120 directly underlying the redistribution layer 102 (see FIG. 1). More specifically, the wiring layer 111 may be interposed between the quantity of dielectric material 114F directly adjacent to the redistribution layer 102 on a side of the redistribution layer 102 proximate to the substrate 104 and the next quantity of dielectric material 114E interposed between the first quantity of dielectric material 114F and the substrate 104 (see FIG. 1). As a specific, nonlimiting example, the wiring layer 111 may be configured as wiring layer M4 in some embodiments. The wiring layer 111 may include, for example, different sets of vias 112, some of which may be electrically connected to the first region 126 of the overlying redistribution layer 102 (and may conduct the associated signals/voltage (e.g., a positive supply voltage, such as, for example, VDD, VDD2)), and others of which may be electrically connected to the second region 136 of the overlying redistribution layer 102 (and may conduct the associated signals/voltage (e.g., a negative supply voltage, such as, for example, VSS)) (see FIG. 1). The vias 112 may also be connected to third regions 150 of electrically conductive material 120, which may route the signals/voltages coupled to the vias 112 laterally between the quantities of dielectric material 114E and 114F across the M4 wiring layer. The third regions 150 of electrically conductive material 120 may be configured as, for example, respective wires, wiring, conductive lines, or traces of the various wiring layers 111 interposed between the redistribution layer 102 and the substrate 104 (see FIG. 1).

In sections of the wiring layers 111 located closer to the substrate 104 than the first region 126 and the second region 136 of the redistribution layer 102 (see FIG. 2), the width of the laterally extending, electricity-routing members of the wiring layer 111 may be less than the widths of the first region 126 and the second region 136 (see FIG. 2). The first region 126 and the second region 136 of the redistribution layer 102 may be more distant from the substrate 104 (see FIG. 1) than any electricity routing member of the wiring layers 111 other than the vias 112. For example, the first region 126 and the second region 136 may be located on a side of the outermost quantity of dielectric material 114F opposite the substrate 104.

Laterally extending, electricity routing members of the wiring layers 111 located between other quantities of dielectric material 114A through 114E closer to the substrate 104, such as the third regions 150 of electrically conductive material 120 shown in FIGS. 4 through 7, may have widths smaller than the greatest widths of the first region 126 and the second region 136. For example, the maximum width of the first region 126 and the second region 136 may be, for example, at least about 10 times greater than the minimum acceptable width (e.g., maximum actual width) of any third region 150 of electrically conductive material 120 extending laterally from a via 112, as measured in a direction at least substantially perpendicular to an intended direction of flow of electricity through the third region 150. More specifically, the maximum width of the first region 126 and the second region 136 may be, for example, at least about 25 times greater than the minimum acceptable width of any third region 150. As a specific, nonlimiting example, the maximum width of the first region 126 and the second region 136 may be, for example, at least about 50 times greater (e.g., about 100 times greater) than the minimum acceptable width of any third region 150.

Figure 5:
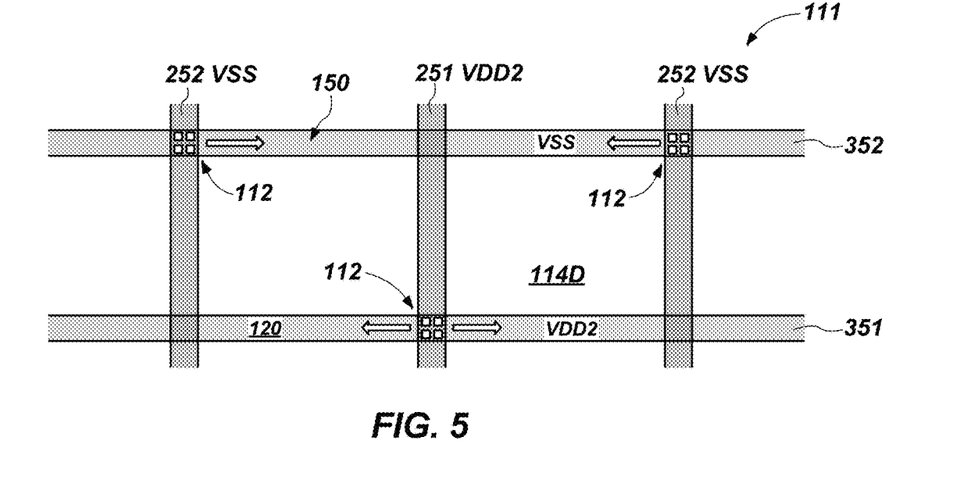
FIG. 5 is a zoomed-in top view of a portion of another wiring layer of FIG. 1.

FIG. 5 is a zoomed-in top view of the same portion of the semiconductor device of FIGS. 3 and 4 and showing the M3 layer of FIG. 4, as well as wiring on the M2 layer and vias between the M3 layer and the M2 layer. Vias 112 in a grouping in the center of the figure may convey the VDD2 voltage from the wire 251 on the M3 layer down to a wire 351 on the M2 layer. Vias 112 in groupings on the left and right sides of the figure may convey the VSS voltage from the wires 252 on the M3 layer down to a wire 352 on the M2 layer.

The wiring layer 111 depicted in FIG. 5 may correspond, for example, to the quantities of electrically conductive material 120 directly underlying the wiring layer 111 shown and described in connection with FIG. 4. More specifically, the wiring layer 111 may be interposed between the quantity of dielectric material 114E directly adjacent to the electrically conductive material 120 shown in FIG. 4 and the next quantity of dielectric material 114D interposed between that quantity of dielectric material 114E and the substrate 104 (see FIG. 1). As a specific, nonlimiting example, the wiring layer 111 may be configured as wiring layer M3 in some embodiments. The wiring layer 111 may include, for example, different sets of vias 112, some of which may be electrically connected to the first region 126 of the overlying redistribution layer 102 (and may conduct the associated signals/voltage (e.g., a positive supply voltage, such as, for example, VDD, VDD2)), and others of which may be electrically connected to the second region 136 of the overlying redistribution layer 102 (and may conduct the associated signals/voltage (e.g., a negative supply voltage, such as, for example, VSS)) (see FIG. 1). The vias 112 may also be connected to third regions 150 of electrically conductive material 120, which may route the signals/voltages received by the vias 112 laterally between the quantities of dielectric material 114D and 114E across the active surface 106 of the underlying substrate 104 (see FIG. 1).

Figure 6:
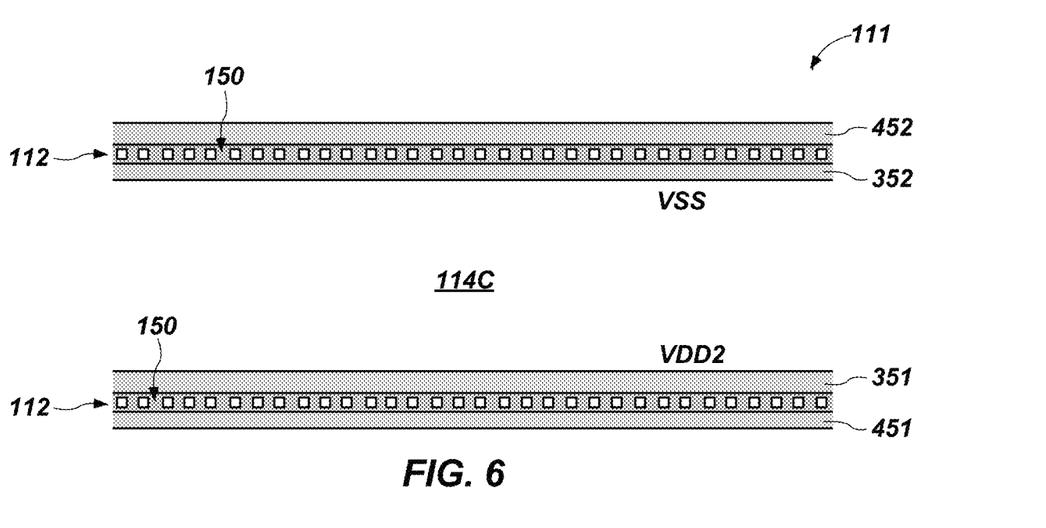
FIG. 6 is a zoomed-in top view of a portion of another wiring layer of FIG. 1.

FIG. 6 is a zoomed-in top surface view of the same portion of the semiconductor device of FIGS. 3 through 5 and showing the M2 layer of FIG. 5, as well as wiring on the M1 layer and vias between the M2 layer and the M1 layer. Vias 112 in string along the bottom side of the figure may convey the VDD2 voltage from the wire 351 on the M2 layer down to a wire 451 on the M1 layer. Vias 112 in a string along the top side of the figure may convey the VSS voltage from the wires 352 on the M2 layer down to a wire 452 on the M1 layer.

The wiring layer 111 depicted in FIG. 6 may correspond, for example, to the quantities of electrically conductive material 120 directly underlying the wiring layer 111 shown and described in connection with FIG. 5. More specifically, the wiring layer 111 may be interposed between the quantity of dielectric material 114D directly adjacent to the electrically conductive material 120 shown in FIG. 5 and the next quantity of dielectric material 114C interposed between that quantity of dielectric material 114D and the substrate 104 (see FIG. 1). As a specific, nonlimiting example, the wiring layer 111 may be configured as wiring layer M2 in some embodiments. The wiring layer 111 may include, for example, third regions 150 of electrically conductive material 120, which may route the signals/voltages received by the vias 112 laterally between the quantities of dielectric material 114C and 114D across the active surface 106 of the underlying substrate 104 (see FIG. 1).

Figure 7:
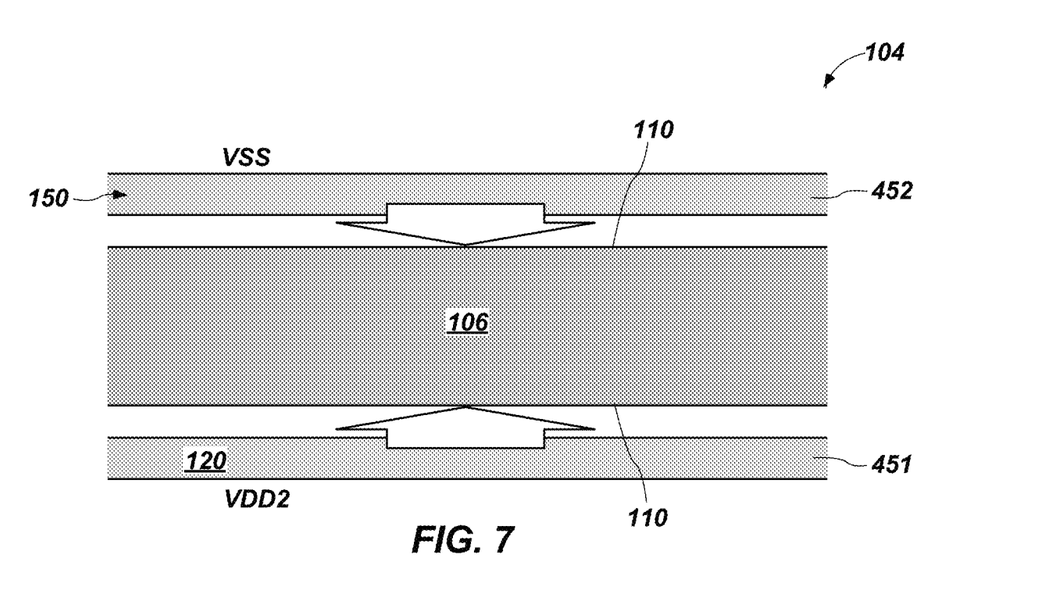
FIG. 7 is a zoomed-in top view of an active surface of the semiconductor device of FIG. 1.

FIG. 7 is a zoomed-in top view of the same portion of the semiconductor device of FIGS. 3 through 6 and showing the M1 layer of FIG. 6, as well as active area regions on the substrate. Wiring and vias, shown generally as a thick arrow near the bottom side of the figure, may convey the VDD2 voltage from the wire 451 on the M1 layer down to active areas 106 on the substrate. Wiring and vias, shown generally as a thick arrow near the top of the figure, may convey the VSS voltage from the wires 452 on the M3 layer down to active areas 106 on the substrate.

The active surface 106 may include diffusion regions 110 of integrated circuitry (e.g., transistors) distributed along the active surface 106. One of the third regions 150 of electrically conductive material 120 shown in FIG. 5 may receive and conduct a first signal or voltage by indirect connection to the first region 126 (see FIG. 2), and the other of the third regions 150 of electrically conductive material 120 shown in FIG. 7 may receive and conduct a second, different signal or voltage by indirect connection to the second region 136 (see FIG. 2). Though not specifically shown in FIG. 7 for the sake of simplicity, additional electrical-routing members other than the third regions 150 may be provided to extend to, and electrically connect with, the depicted diffusion regions 110 of integrated circuitry. More specifically, one of the third regions 150 of electrically conductive material 120 shown in FIG. 8 (e.g., the upper third region 150) may conduct, for example, a positive supply voltage (e.g., VDD, VDD2) to the associated diffusion regions 110 of integrated circuitry, and the other of the third regions 150 of electrically conductive material 120 shown in FIG. 8 (e.g., the lower third region 150) may conduct a negative supply voltage (e.g., VSS) to the associated diffusion regions 110 of integrated circuitry. As a specific, nonlimiting example, the active surface 106 may be configured as wiring layer M1.

Certain voltages, such as, for example, VDD2 and VSS, may be supplied to large proportions of the active surface 106. For example, diffusion regions 110 extending laterally along the active surface 106 across multiple rows 130 of vias 112 (see FIG. 8) may be supplied with the voltages, and the shapes and configurations for the regions 126 and 136 of electrically conductive material 120 disclosed herein may enable those voltages to be supplied to the relevant diffusion regions 110 at the active surface with lower resistance, causing the actual voltage to better match input or designed voltage values.

FIG. 8 is a zoomed-out top view of another embodiment of a portion of a redistribution layer 160. The redistribution layer 160 may include a first set 162 of vias 112, generally corresponding to a first row 130 (see FIG. 2) of vias 112, and a second, laterally adjacent set 164 of vias 112, generally corresponding to a second, different row 130 (see FIG. 2) of vias 112. Each of the first set 162 of vias 112 and second set 164 of vias 112 may include its own first subset 128 of vias 112 configured for transmission of a first signal or voltage through interconnection with the first region 126 and second subset 138 of vias 112 configured for transmission of a second, different signal or voltage through interconnection with the second region 136.

The first region 126 of the electrically conductive material 120 may have a first width $W_1$ proximate to, and on the second lateral side 140 of, the first set 162 of the vias 112 and a second, greater width $W_2$ proximate to, and on the first lateral side 132 of, the second, laterally adjacent set 164 of the vias 112, as measured in a direction $D_2$ at least substantially perpendicular to a line 166 forming a shortest distance between the first set 162 of vias 112 and the second set 164 of vias 112. The first width $W_1$ may represent the smallest width of the first region 126, and the second width $W_2$ may represent the greatest width of the first region 126 between the first set 162 of vias 112 and the second set 164 of vias 112. For example, the second width $W_2$ of the first region 126 may be at least about five times greater than the first width $W_1$. More specifically, the second width $W_2$ may be, for example, at least about 10 times (e.g., about 20 times) greater than the first width $W_1$.

The second region 136 of the electrically conductive material 120 may have a third width $W_3$ proximate to, and on the second lateral side 140 of, the first set 162 of the vias 112 and a fourth, smaller width $W_4$ proximate to, and on the first lateral side 132 of, the second, laterally adjacent set 164 of the vias 112, as measured in the direction $D_2$ at least substantially perpendicular to the line 166 forming the shortest distance between the first set 162 of vias 112 and the second set 164 of vias 112. The third width $W_3$ may represent the greatest width of the second region 136, and the fourth width $W_4$ may represent the smallest width of the second region 136 between the first set 162 of vias 112 and the second set 164 of vias 112. For example, the third width $W_3$ of the first region 126 may be at least about five times greater than the fourth width $W_4$. More specifically, the third width $W_3$ may be, for example, at least about 10 times (e.g., about 20 times) greater than the fourth width $W_4$. In some embodiments, the first width $W_1$ of the first region 126 may be at least substantially equal to the fourth width $W_4$ of the second region 136, and the second width $W_2$ of the first region 126 may be at least substantially equal to the third width $W_3$ of the second region 136.

The first region 126 may further include a first, intermediate section 168 having a fifth width $W_5$ between the first width $W_1$ and the second width $W_2$ and located proximate to a midpoint 170 between the first set 162 of the vias 112 and the second set 164 of the vias 112. The second region 136 may likewise include a second, intermediate section 172 having a sixth width $W_6$ between the third width $W_3$ and the fourth width $W_4$ and located proximate to the midpoint 170 between the first set 162 of the vias 112 and the second set 164 of the vias 112. In some embodiments, the fifth width $W_5$ of the first, intermediate section 168 of the first region 126 may be at least substantially equal to the sixth width $W_6$ of the second, intermediate section 172 of the second region 136.

To facilitate such variation in width, a shape of the first region 126, as viewed in a direction at least substantially perpendicular to the active surface 106 of the substrate 104 (see FIG. 1) may be a rectangle having one side proximate to the second set 164 of vias 112. The rectangle of the first region 126 may have a first right triangle extending from the rectangle toward the first set 162 of the vias 112 and a second right triangle extending from the rectangle along the second set 164 of the vias 112. Hypotenuses of the first right triangle and the second right triangle may extend at least substantially parallel to one another, causing the width of the first region 126 to increase from proximate to the first set 162 of the vias 112 to the first, intermediate region 168 and increase again from the first, intermediate region 168 to proximate to the second set 164 of the vias 112. In other embodiments, corners may be rounded, the change in width between the various sections of the first region 126 may be non-constant (producing a curved edge in sections of varying width), or both.

A shape of the second region 136, as viewed in a direction at least substantially perpendicular to the active surface 106 of the substrate 104 (see FIG. 1) may be a rectangle having one side proximate to the first set 162 of vias 112. The rectangle of the second region 136 may have a first right triangle extending from the rectangle toward the second set 164 of the vias 112 and a second right triangle extending from the rectangle along the first set 162 of the vias 112.

Hypotenuses of the first right triangle and the second right triangle may extend at least substantially parallel to one another, causing the width of the second region 136 to decrease from proximate to the first set 162 of the vias 112 to the second, intermediate region 172 and increase again from the second, intermediate region 172 to proximate to the second set 164 of the vias 112. In other embodiments, corners may be rounded, the change in width between the various sections of the second region 136 may be non-constant (producing a curved edge in sections of varying width), or both.

As another illustrative example, semiconductor devices in accordance with this disclosure may include a substrate having a semiconductor material and a redistribution layer supported on the substrate. The redistribution layer may include electrically conductive material located on a side of a dielectric material opposite the substrate. Vias may extend from the electrically conductive material through the dielectric material toward the substrate. A first region of the electrically conductive material may have a first width proximate to a first set of the vias and a second, greater width proximate to a second, laterally adjacent set of the vias, as measured in a direction at least substantially perpendicular to a line forming a shortest distance between the first set of vias and the second set of vias. A second region of the electrically conductive material may have a third width proximate to the first set of the vias and a fourth, smaller width proximate to the second set of the vias.

Variations in the width of the first region 126 and the second region 136, as well as the rate of change of the width of the first region 126 and the second region 136, proximate to the location where the first region 126 and the second region 136 connect to the respective vias 112 in a given row 130 or set 162 or 164 may reduce the resistance of the electrically conductive material 120. For example, shapes for the first region 126 and the second region 136 (and their accompanying vias 112) in accordance with this disclosure may reduce resistances of the first region 126 and the second region 136, respectively, by at least 10% proximate to the respective sets 162 and 164 of the vias 112 when compared to a first region and a second region of constant width. As a result, signals and voltages conducted from the bond pads 116, through the vias 112, and across the first region 126 and second region 136 of electrically conductive material may more closely match intended and/or input signals and voltages, particularly as distance from the bond pads 116 increases, enabling a more consistent response from diffusion regions 110 of integrated circuitry across the active surface 106 of the substrate 104 (see FIG. 1).

When designing redistribution and wiring layers for semiconductor devices, and particularly for next-generation memory devices (e.g., LPDDR5), the inventors have found that resistance of the redistribution and wiring layers, and particularly the resistance of the electrically conductive materials in the redistribution layer, can reduce the signal quality of signals conducted by the redistribution and wiring layers, can cause values for voltages to drift from their intended or designed values, or both. Performance of the resulting semiconductor devices may be inconsistent, and may fall outside target or specified performance specifications for the semiconductor devices. By manipulating the width, shape, and/or rate of change of the width/shape of the regions of electrically conductive material (e.g., wires, wiring, conductive lines, traces), the inventors have found that signal quality is improved and voltage values more closely match intended and designed values.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A semiconductor device, comprising:
   a substrate comprising a semiconductor material;
   a redistribution layer supported on the substrate, the redistribution layer comprising electrically conductive material located on a side of a dielectric material opposite the substrate; and
   vias extending from the electrically conductive material through the dielectric material toward the substrate;
   wherein a first region of the electrically conductive material comprises a first width proximate to a first set of the vias and a second, greater width proximate to a second, laterally adjacent set of the vias, as measured in a direction at least substantially perpendicular to a line forming a shortest distance between the first set of the vias and the second set of the vias; and
   wherein a second region of the electrically conductive material comprises a third width proximate to the first set of the vias and a fourth, smaller width proximate to the second set of the vias.

2. The semiconductor device of claim 1, wherein the first width of the first region is at least substantially equal to the fourth width of the second region and the second width of the first region is at least substantially equal to the third width of the second region.

3. The semiconductor device of claim 1, wherein the first region comprises a first intermediate section having a fifth width between the first width and the second width and located proximate to a midpoint between the first set of the vias and the second set of the vias, and the second region comprises a second, intermediate section having a sixth width between the third width and the fourth width and located proximate to a midpoint between the first set of the vias and the second set of the vias.

4. The semiconductor device of claim 3, wherein a width of the first region increases gradually from the first width to the fifth width and increases gradually from the fifth width to the second width.

5. The semiconductor device of claim 3, wherein a width of the second region decreases gradually from the third width to the sixth width and decreases gradually from the sixth width to the fourth width.

6. The semiconductor device of claim 3, wherein the fifth width of the first intermediate section of the first region is at least substantially equal to the sixth width of the second intermediate section of the second region.

7. The semiconductor device of claim 1, wherein the redistribution layer comprises electricity-routing members other than the vias, first region, and second region, wherein the redistribution layer comprises bond pads, and wherein the first region and the second region are more distant from the substrate than any of the electricity-routing members and the bond pads of the redistribution layer other than the vias.

8. The semiconductor device of claim 1, wherein a shape of the first region reduces a resistance of the first region by at least 10% proximate to the second set of the vias when compared to another first region of constant width and a shape of the second region reduces a resistance of the second region by at least 10% proximate to the first set of the vias as compared to another second region of constant width.

9. The semiconductor device of claim 1, wherein the substrate comprises at least one of a power supply circuit, an access pass circuit, and a buffer circuit located laterally proximate to the vias.

10. The semiconductor device of claim 1, wherein the substrate comprises at least one of a logic circuit and compensation capacitance located laterally distal from the vias.

11. The semiconductor device of claim 1, wherein the redistribution layer comprises other regions of electrically conductive material in portions of the redistribution layer closer to the substrate than the first region and the second region, and wherein a maximum width of the first and second regions is at least about 10 times greater than a maximum width of the other regions of conductive material.

12. The semiconductor device of claim 1, wherein a shape of the first region, as viewed in a direction at least substantially perpendicular to an active surface of the substrate is a rectangle having a first right triangle extending from the rectangle toward the first set of the vias and a second right triangle extending from the rectangle along the second set of the vias, hypotenuses of the first right triangle and the second right triangle extending at least substantially parallel to one another.

13. The semiconductor device of claim 1, wherein a first subset of the first set of the vias are connected to the first region and a second subset of the first set of the vias are connected to the second region, the vias of the first subset being directly adjacent to the vias of the second subset in an alternating pattern along the first set of the vias.

14. The semiconductor device of claim 13, wherein the first region is connected to the first subset of vias from a first lateral side of the first set of vias, the first region occupying more than half of a width of the first set of vias on the first lateral side of the first set of vias, and the second region is connected to a second subset of vias from a second, opposite lateral side of the first set of vias, the second region occupying more than half of the width of the first set of vias on a second lateral side of the first set of vias.

15. The semiconductor device of claim 13, wherein the first subset of vias is configured to provide a positive supply voltage to the substrate and the second subset of vias is configured to provide a negative supply voltage to the substrate.

16. A semiconductor device, comprising:
a substrate comprising a semiconductor material;
a redistribution layer supported on the substrate, the redistribution layer comprising electrically conductive material located on a side of a dielectric material opposite the substrate; and
vias extending through the dielectric material toward the substrate;
wherein a first region of the electrically conductive material is connected to a first subset of vias in a row of the vias from a first lateral side of the row, the first region occupying more than half of a width of the row on the first lateral side, as measured in a direction parallel to a geometric center of the row extending through or adjacent to all the vias in the row; and
wherein a second region of the electrically conductive material is connected to a second subset of vias in the row from a second, opposite lateral side of the row, the second region occupying more than half of the width of the row on a second lateral side.

17. The semiconductor device of claim 16, wherein the first subset of vias is configured to provide a positive supply voltage to the substrate and the second subset of vias is configured to provide a negative supply voltage to the substrate.

18. The semiconductor device of claim 16, wherein:
the first region of the electrically conductive material comprises a first width proximate to the row and a second, greater width proximate to a second, laterally adjacent row of vias, as measured in a direction at least substantially perpendicular to a line forming a shortest distance between the row and the second row of vias; and
the second region of the electrically conductive material comprises a third width proximate to the row and a fourth, smaller width proximate to the second row.

19. The semiconductor device of claim 18, wherein the width of the first region increases gradually from the first width to a fifth, intermediate width within a first, intermediate section of the first region, an angle between the first region and the line within the first, intermediate section being between about 30° and about 60°.

20. The semiconductor device of claim 19, wherein the width of the first region increases gradually from the fifth width to the second width within a second, intermediate section of the first region, an angle between the first region and the line within the second, intermediate section being between about 30° and about 60°.

* * * * *